(12) United States Patent
Tsai et al.

(10) Patent No.: US 11,895,848 B2
(45) Date of Patent: *Feb. 6, 2024

(54) LAYOUT PATTERN FOR MAGNETORESISTIVE RANDOM ACCESS MEMORY

(71) Applicant: UNITED MICROELECTRONICS CORP., Hsin-Chu (TW)

(72) Inventors: Ya-Huei Tsai, Tainan (TW); Rai-Min Huang, Taipei (TW); Yu-Ping Wang, Hsinchu (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/750,386

(22) Filed: May 22, 2022

(65) Prior Publication Data

US 2022/0285437 A1 Sep. 8, 2022

Related U.S. Application Data

(63) Continuation of application No. 16/792,271, filed on Feb. 16, 2020, now Pat. No. 11,374,055.

(30) Foreign Application Priority Data

Jan. 16, 2020 (TW) .................................. 109101457

(51) Int. Cl.
*H10B 61/00* (2023.01)
*H01L 23/528* (2006.01)
(Continued)

(52) U.S. Cl.
CPC ............ *H10B 61/22* (2023.02); *H01L 23/528* (2013.01); *H10N 50/80* (2023.02); *G11C 11/161* (2013.01); *H01F 10/3254* (2013.01); *H10N 50/85* (2023.02)

(58) Field of Classification Search
CPC ..... H01L 27/228; H01L 23/528; H01L 43/02; H01L 43/10; H01B 61/22; H01N 50/80; G11C 11/161; H01F 10/3254; H10N 50/85

See application file for complete search history.

(56) References Cited

U.S. PATENT DOCUMENTS 6,211,544 B1   4/2001  Park et al.
9,496,314 B1 * 11/2016  Lu ...................... G11C 11/1659
(Continued)

FOREIGN PATENT DOCUMENTS

EP      2 156 472       2/2010
EP      2 156 472 B1    7/2015
(Continued)

*Primary Examiner* — Marc Anthony Armand
(74) *Attorney, Agent, or Firm* — Winston Hsu

(57) ABSTRACT

A layout pattern for magnetoresistive random access memory (MRAM) includes a substrate having a first active region, a second active region, and a word line connecting region between the first active region and the second active region, a first gate pattern extending along a first direction from the first active region to the second active region, a second gate pattern extending along the first direction from the first active region to the second active region, a first magnetic tunneling junction (MTJ) between the first gate pattern and the second pattern and within the word line connecting region, and a second MTJ between the first gate pattern and the second gate pattern in the first active region. Preferably, top surfaces of the first MTJ and the second MTJ are coplanar.

9 Claims, 6 Drawing Sheets

(51) Int. Cl.
*H10N 50/80* (2023.01)
*G11C 11/16* (2006.01)
*H01F 10/32* (2006.01)
*H10N 50/85* (2023.01)

(56) References Cited

U.S. PATENT DOCUMENTS

| | | |
|---|---|---|
| 2005/0076320 A1 | 4/2005 | Maeda |
| 2010/0232210 A1* | 9/2010 | Kajiyama ............... H10B 61/22 365/210.1 |
| 2012/0063216 A1 | 3/2012 | Fujita |
| 2012/0087184 A1 | 4/2012 | Lee |
| 2016/0300843 A1 | 10/2016 | Jung |
| 2017/0084319 A1* | 3/2017 | Chun ........................ G11C 7/12 |
| 2017/0352801 A1* | 12/2017 | Lee ........................ H10B 61/22 |
| 2020/0194662 A1* | 6/2020 | Chuang .................. H01L 43/02 |
| 2021/0098685 A1* | 4/2021 | Liou ....................... H10N 50/01 |

FOREIGN PATENT DOCUMENTS

| | | |
|---|---|---|
| JP | 2004-119897 A | 4/2004 |
| JP | 2012-195038 A | 10/2012 |
| TW | 200635048 | 10/2006 |
| TW | I437692 | 5/2014 |

\* cited by examiner

LAYOUT PATTERN FOR MAGNETORESISTIVE RANDOM ACCESS MEMORY

CROSS REFERENCE TO RELATED APPLICATIONS

This application is a continuation application of U.S. application Ser. No. 16/792,271, filed on Feb. 16, 2020. The content of the application is incorporated herein by reference.

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a layout pattern for magnetoresistive random access memory (MRAM) includes a substrate having a first active region, a second active region, and a word line connecting region between the first active region and the second active region and a gate pattern extending from the first active region to the second active region, in which the gate pattern includes a H-shape according to a top view. Preferably, the gate pattern includes a first gate pattern extending along a first direction from the first active region to the second active region, a second gate pattern extending along the first direction from the first active region to the second active region, and a third gate pattern connecting the first gate pattern and the second gate pattern along a second direction.

According to another aspect of the present invention, a layout pattern for magnetoresistive random access memory (MRAM) includes a substrate having a first active region, a second active region, and a word line connecting region between the first active region and the second active region, a first gate pattern extending along a first direction from the first active region to the second active region, a second gate pattern extending along the first direction from the first active region to the second active region, a first magnetic tunneling junction (MTJ) between the first gate pattern and the second gate pattern and within the word line connecting region, and a second MTJ between the first gate pattern and the second gate pattern in the first active region. Preferably, top surfaces of the first MTJ and the second MTJ are coplanar.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
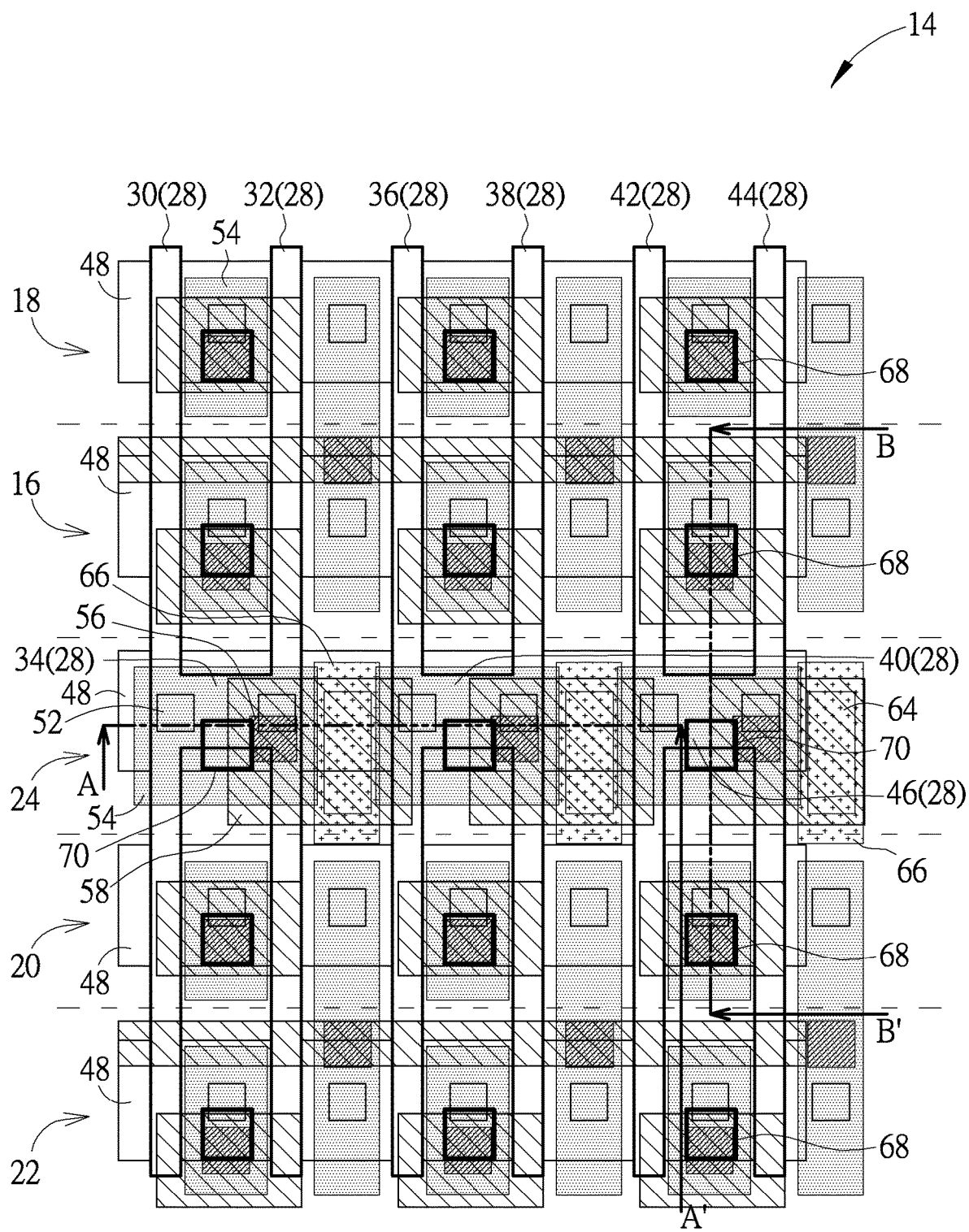
FIG. 1 illustrates a layout top view of a semiconductor device according to an embodiment of the present invention.
Figure 2:
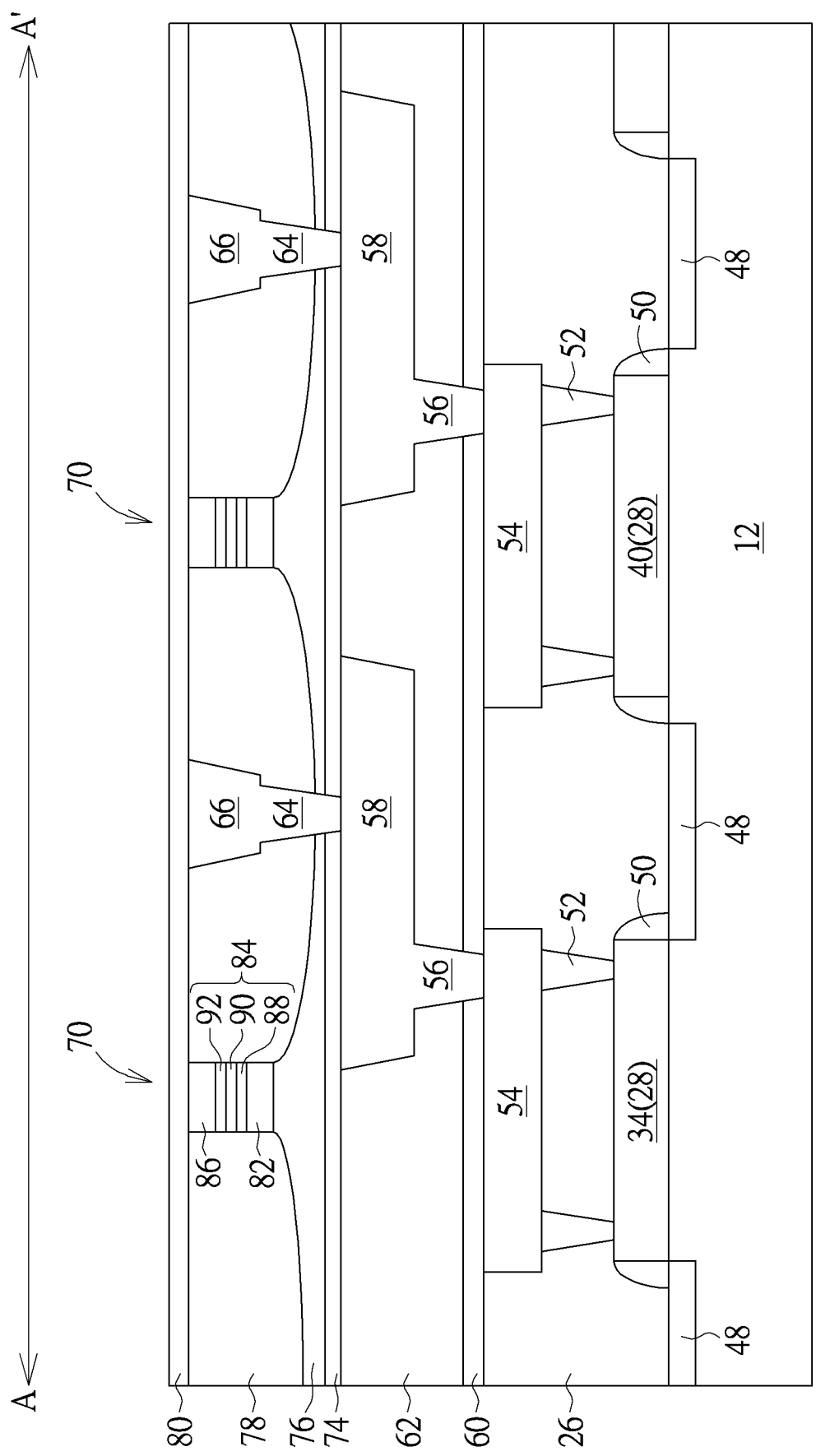
FIG. 2 illustrates a cross-section of FIG. 1 along the sectional line AA'.
Figure 3:
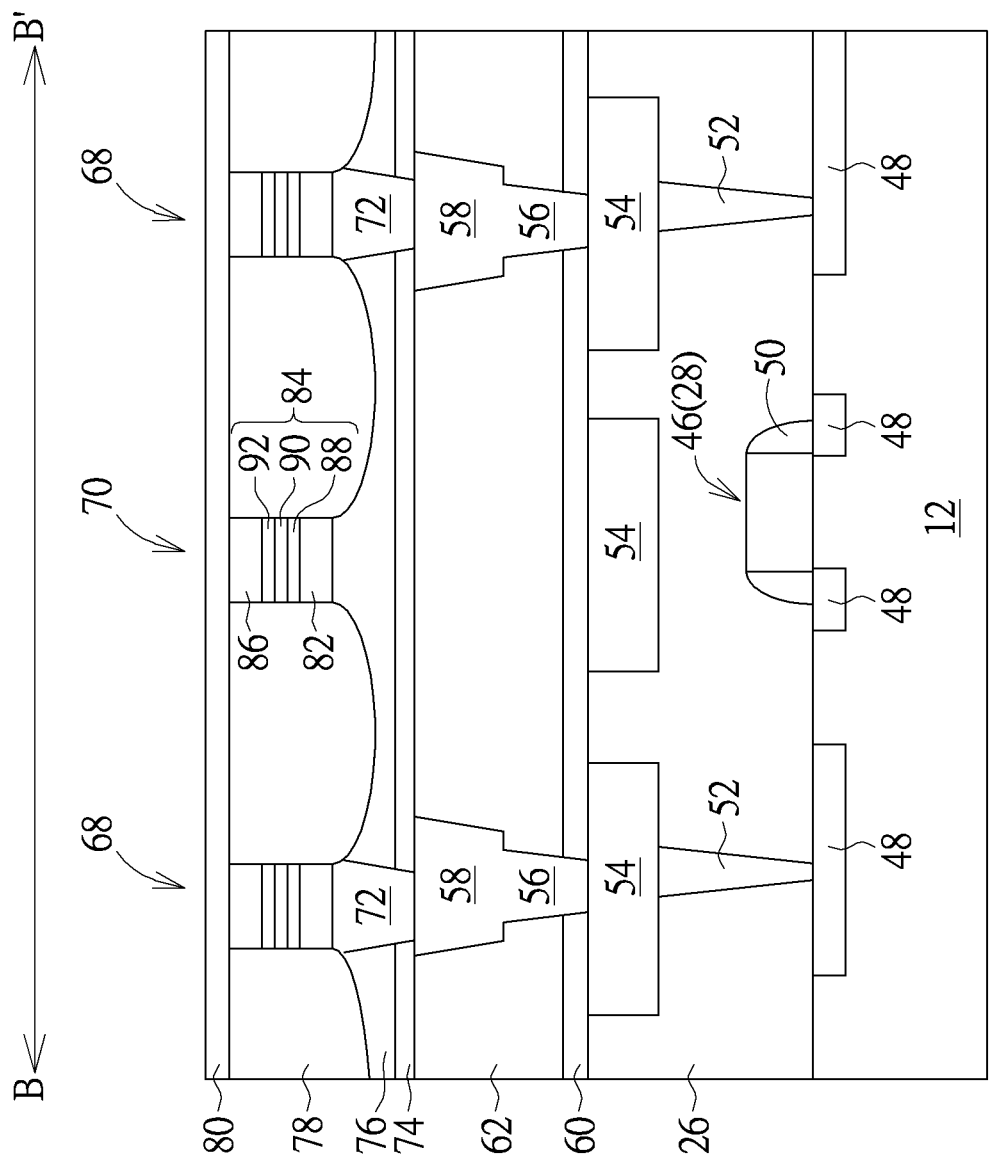
FIG. 3 illustrates a cross-section of FIG. 1 along the sectional line BB'.

Referring to FIGS. 1-3, FIG. 1 illustrates a layout top view of a semiconductor device, or more specifically a MRAM device according to an embodiment of the present invention, FIG. 2 illustrates a cross-section of FIG. 1 along the sectional line AA', and FIG. 3 illustrates a cross-section of FIG. 1 along the sectional line BB'. As shown in FIGS. 1-3, the MRAM device preferably includes a substrate 12 made of semiconductor material, in which the semiconductor material could be selected from the group consisting of silicon (Si), germanium (Ge), Si—Ge compounds, silicon carbide (SiC), and gallium arsenide (GaAs). A MRAM region 14 and a logic region (not shown) are defined on the substrate 12, in which the MRAM region 14 further includes a plurality of active regions 16, 18, 20, 22 and a word line connecting region 24 (also referred to as a word line strap). Preferably, the active regions 16, 18, 20, 22 are disposed extending along a direction such as the X-direction while the word line connecting region 24 is also extending along the X-direction between the active regions 16, 20.

Active devices such as metal-oxide semiconductor (MOS) transistors, passive devices, conductive layers, and interlayer dielectric (ILD) layer 26 could also be formed on top of the substrate 12. More specifically, planar MOS transistors or non-planar (such as FinFETs) MOS transistors could be formed on the substrate 12, in which the MOS transistors could include transistor elements such as gate structures such as gate patterns 28, 30, 32, 34, 36, 38, 40, 42, 44, 46, source/drain regions or diffusion regions 48, spacers 50, epitaxial layers, and contact etch stop layer (CESL). The ILD layer 26 could be formed on the substrate 12 to cover the MOS transistors, and a plurality of contact plugs 52, 54 could be formed in the ILD layer 26 to electrically connect to the gate structures such as the gate patterns 28, 30, 32, 34, 36, 38, 40, 42, 44, 46 and the diffusion regions 48 of MOS transistors. Since the fabrication of planar or non-planar transistors and ILD layer is well known to those skilled in the art, the details of which are not explained herein for the sake of brevity.

The semiconductor device also includes metal interconnections 56, 58 disposed on the ILD layer 26 and electrically connected to the metal interconnections 54, a stop layer 60 and an inter-metal dielectric (IMD) layer 62 surrounding the metal interconnections 56, 58, metal interconnections 64, 66 disposed on the metal interconnections 58, MTJs 68 or more specifically active MTJs disposed on the metal interconnections 58 in the active regions 16, 18, 20, 22, dummy MTJs 70 disposed on the IMD layer 62 within the word line connecting region 24 and bottom surface of the dummy MTJs 70 preferably not connecting to the lower level metal interconnections 58, metal interconnections 72 disposed under the MTJs 68, a stop layer 74 and an IMD layer 76 surrounding the metal interconnections 72, another IMD layer 78 disposed on the IMD layer 76 to surround the MTJs 68, dummy MTJs 70, and metal interconnections 64, 66, and another stop layer 80 disposed on the MTJs 68, dummy MTJs 70, and IMD layer 78.

In this embodiment, each of the metal interconnections 54, 56, 58, 64, 66 could be fabricated according to a single damascene or dual damascene process and embedded in the IMD layer and/or stop layer while electrically connected to each other. For instance, each of the metal interconnections 54 preferably include a trench conductor, each of the metal interconnections 56 include a via conductor, each of the metal interconnections 58 include a trench conductor, each of the metal interconnections 64 include a via conductor, and each of the metal interconnections 66 include a trench conductor. Preferably, the metal interconnection 54 could also be referred to as the first level metal interconnect layer M1, the metal interconnection 56 could also be referred to as the first level via conductor layer V1, the metal interconnection 58 could be referred to as the second level metal interconnect layer M2, the metal interconnection 64 could be referred to as the second level via conductor layer V2, and the metal interconnections 66 could be referred to as the third level metal interconnect layer M3.

Moreover, each of the metal interconnections 54, 56, 58, 64, 66 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers are preferably made of copper, the ILD layer 26 is preferably made of silicon oxide, the IMD layers 62, 78 are preferably made of low-k dielectric materials, the IMD layer 76 is preferably made of tetraethyl orthosilicate (TEOS), and the stop layers 60, 74, 80 are preferably made of nitrogen doped carbide (NDC), silicon nitride, silicon carbon nitride (SiCN), or combination thereof.

In this embodiment, each of the MTJs 68 and dummy MTJs 70 include a bottom electrode 82 disposed on the metal interconnections 72 or IMD layer 76, a MTJ stack 84 disposed on the bottom electrode 82, and a top electrode 86 disposed on the MTJ stack 84, in which the MTJ stack 84 preferably includes a pinned layer 88, a barrier layer 90, and a free layer 92. Specifically, each of the bottom electrode 82 and the top electrode 86 are preferably made of conductive material including but not limited to for example Ta, Pt, Cu, Au, Al, or combination thereof. The pinned layer 88 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 88 is formed to fix or limit the direction of magnetic moment of adjacent layers. The barrier layer 90 could include insulating layer containing oxides such as but not limited to for example aluminum oxide ($AlO_x$) or magnesium oxide (MgO). The free layer 92 could be made of ferromagnetic material including but not limited to for example iron, cobalt, nickel, or alloys thereof such as cobalt-iron-boron (CoFeB), in which the magnetized direction of the free layer 92 could be altered freely depending on the influence of outside magnetic field.

As shown in FIG. 1, the MRAM unit preferably includes a plurality of gate patterns 28 such as three sets of gate patterns 28 extending from the active region 18 to the active region 22, in which each of the gate patterns 28 includes a H-shape from a top view perspective. The gate pattern 28 on the leftmost side for example further includes a gate pattern 30 extending along the Y-direction from the active region 18 to the active region 22, a gate pattern 32 parallel to the gate pattern 30 and also extending along the Y-direction from the active region 18 to the active region 22, and a gate pattern 34 extending along the X-direction connecting the gate patterns 30, 32, in which the gate pattern 34 is disposed within the word line connecting region 24 while the gate patterns 30, 32 are disposed to cross the active regions 16, 18, 20, 22 and the word line connecting region 24 at the same time.

Viewing from a more detailed perspective, the diffusion regions 48 are extending along the X-direction not only in the active regions 16, 18, 20, 22 but also in the word line connecting region 24 between the active regions 16, 20, in which the diffusion regions 48 are disposed around the H-shape area within the word line connecting region 24 or more specifically around the gate patterns 30, 32, 34 in the word line connecting region 24. A plurality of MTJs 68 are disposed in the active regions 16, 18, 20, 22 while a plurality of dummy MTJs 70 are disposed in the word line connecting region 24, in which each of the MTJs 68 are disposed in the active regions 16, 18, 20, 22 between two adjacent gate patterns such as gate patterns 30 and 32 while overlapping the diffusion regions 48. Each of the dummy MTJs 70 on the other hand are disposed to overlap the H-shape of the gate pattern 28 such as overlapping the gate patterns 34 and part of the diffusion regions 48. Preferably, each of the MTJs 68 disposed in the active regions 16, 18, 20, 22 and each of the dummy MTJs 70 disposed in the word line connecting region 24 share equal distance or equal pitch therebetween, in which the definition of equal pitch could refer to the distance measuring from the center of a MTJ 68 or dummy MTJ 70 to the center of another MTJ 68 or another dummy MTJ 70, or the distance measuring from an edge of a MTJ 68 or dummy MTJ 70 to an edge of another MTJ 68 or another dummy MTJ 70, which are all within the scope of the present invention.

As shown in the cross-sectional views in FIGS. 2-3, the MTJs 68, dummy MTJs 70, and metal interconnections 64, 66 or third level metal interconnect layer M3 are preferably disposed on the same level, in which the arrangement of dummy MTJs 70 and metal interconnections 64, 66 shown in FIG. 2 involves repeatedly disposing one dummy MTJ 70 immediately adjacent to a metal interconnection 64, 66. In contrast to disposing metal interconnection 72 directly under the MTJs 68, no metal interconnection is disposed directly under the dummy MTJs 70 as the bottom portion or the bottom electrodes 82 under the dummy MTJs 70 preferably contact the IMD layer 76 directly.

Figure 4:
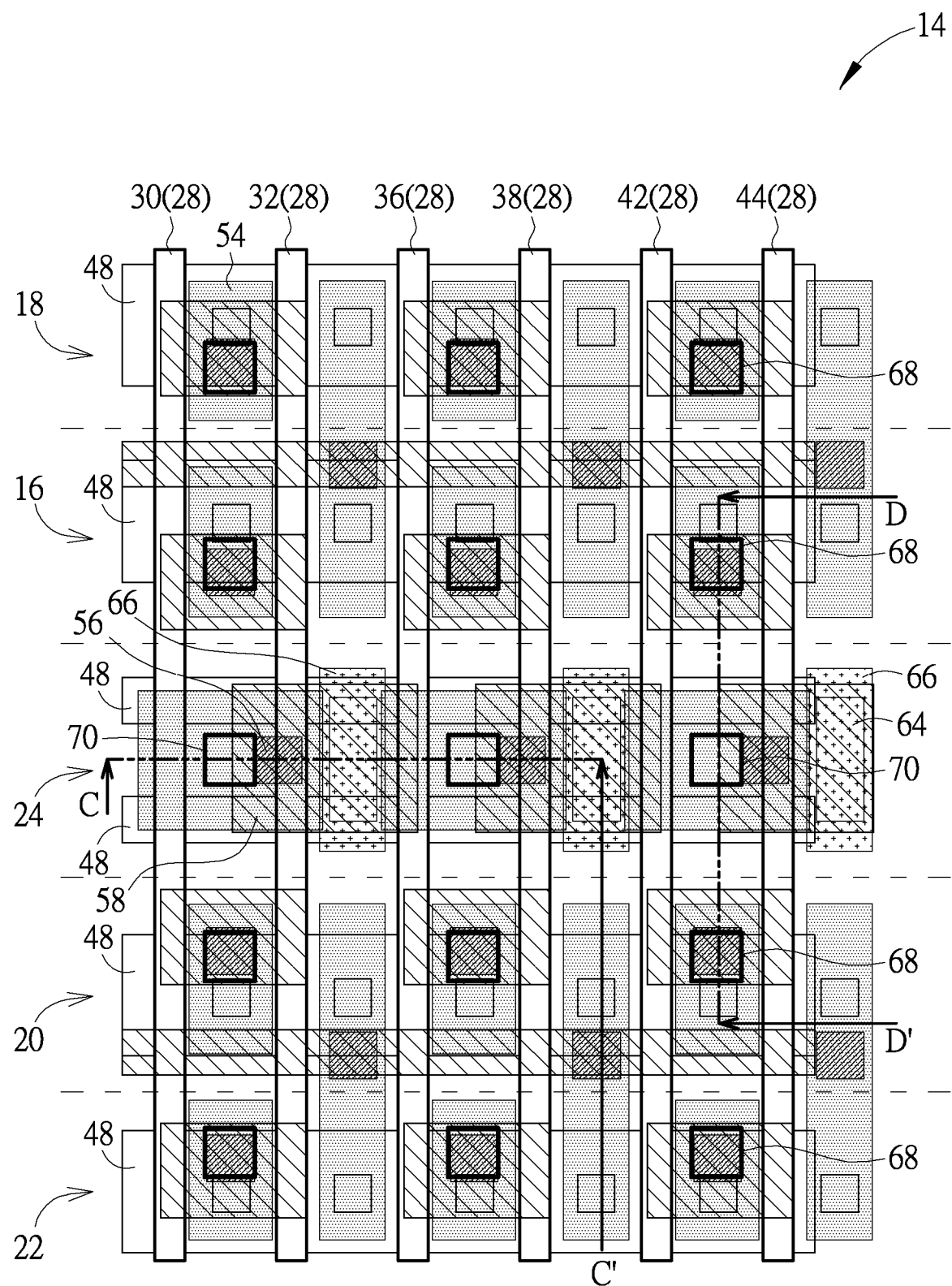
FIG. 4 illustrates a layout top view of a semiconductor device according to an embodiment of the present invention.
Figure 5:
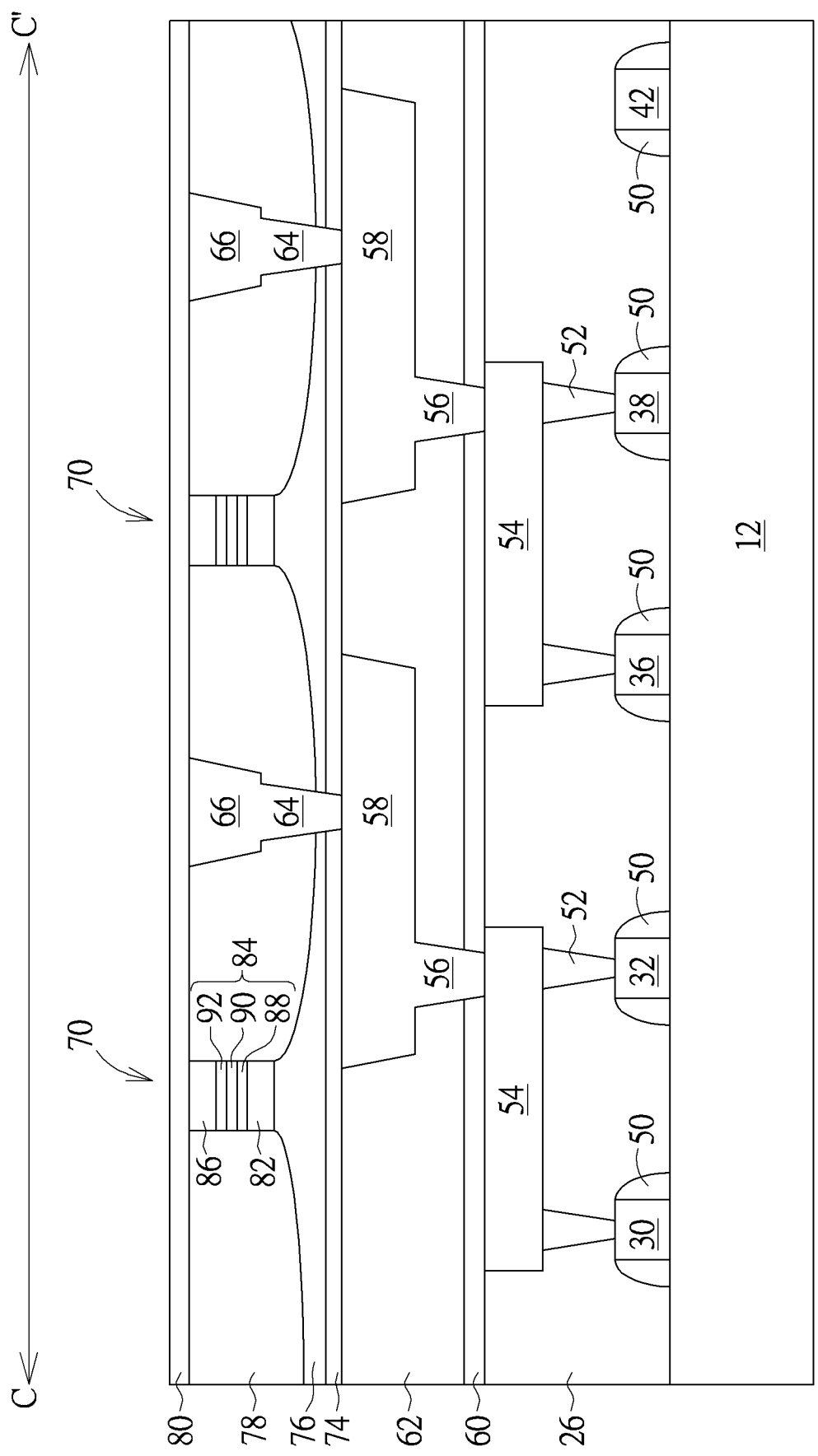
FIG. 5 illustrates a cross-section of FIG. 4 along the sectional line CC'.
Figure 6:
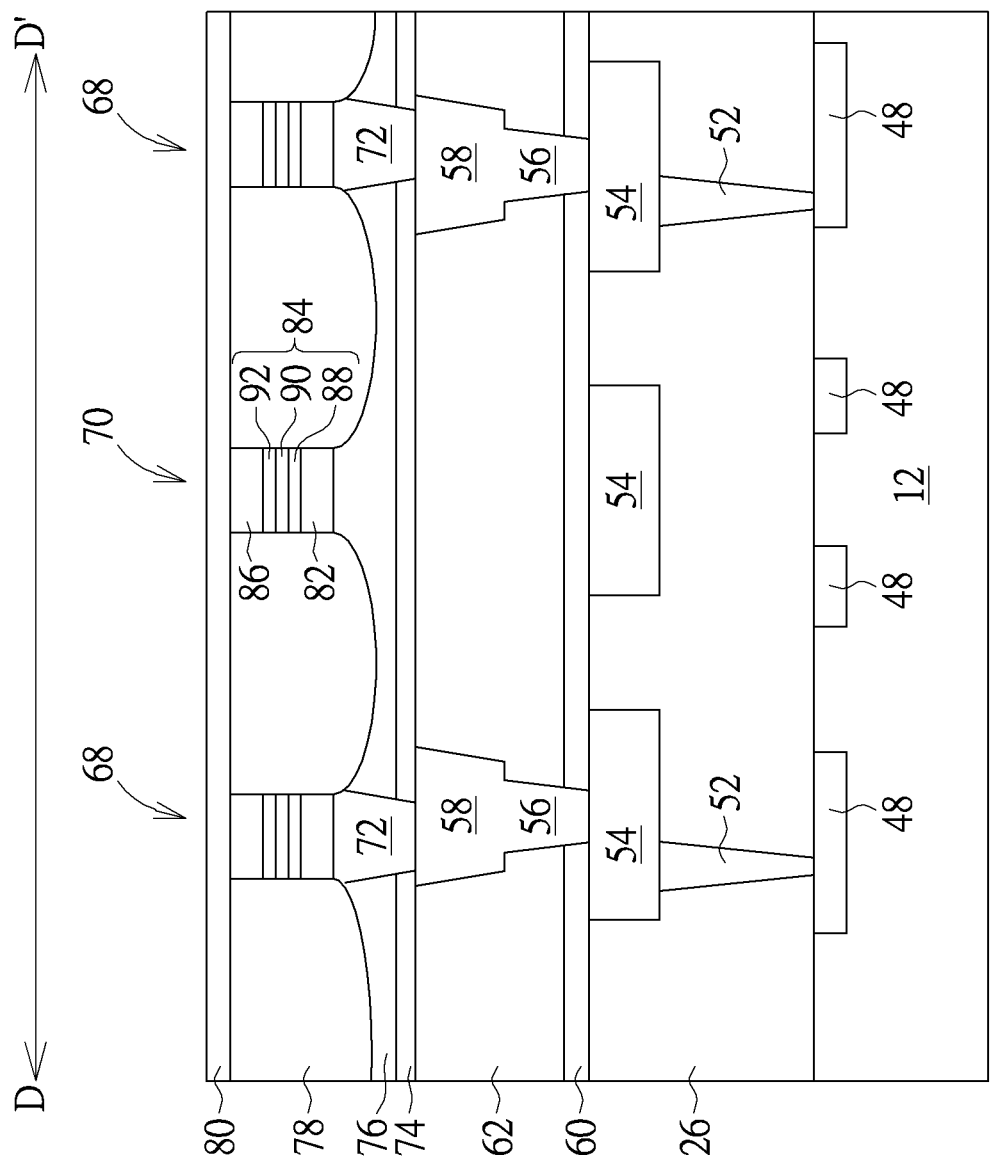
FIG. 6 illustrates a cross-section of FIG. 4 along the sectional line DD'.

Referring to FIGS. 4-6, FIG. 4 illustrates a layout top view of a semiconductor device, or more specifically a MRAM device according to an embodiment of the present invention, FIG. 5 illustrates a cross-section of FIG. 4 along the sectional line CC', and FIG. 6 illustrates a cross-section of FIG. 4 along the sectional line DD'. As shown in FIGS. 4-6, the MRAM unit also includes a plurality of active regions 16, 18, 20, 22 extending along the X-direction, a word line connecting region 24 extending along the same X-direction and between the active regions 16, 20, and a plurality of gate patterns 30, 32, 36, 38, 42, 44 such as three sets of gate patterns 28 extending from the active region 16 through the word line connecting region 24 to the active region 22. In contrast to each set of the gate patterns 28 include a H-shape profile according to a top view perspective as disclosed in the aforementioned embodiment, each set of the gate patterns 28 in this embodiment such as the set on the leftmost side only includes two gate patterns 30, 32 in parallel and extending along a direction orthogonal to the active regions 16, 18, 20, 22 and word line connecting regions 24 from the active region 16 to the active region 22.

Similar to the previous embodiment, the MRAM unit includes diffusion regions 48 extending along the X-direction not only in the active regions 16, 18, 20, 22 but also in the word line connecting region 24 between the active regions 16, 20. In contrast to only a single diffusion region 48 is disposed in each of the active regions 16, 18, 20, 22 and the word line connecting region 24 in the aforementioned embodiment, a single diffusion region 48 extending along the X-direction is disposed in each of the active regions 16, 18, 20, 22 while two diffusion regions 48 extending along the X-direction and adjacent to two sides of the gate patterns 301, 32, 36, 38, 42, 44 are disposed in the word line connecting region 24 in this embodiment. Moreover, a plurality of MTJs 68 are disposed in the active regions 16, 18, 20, 22 while a plurality of dummy MTJs 70 are disposed in the word line connecting region 24, in which the MTJs 68 are disposed in the active regions 16, 18, 20, 22 between two adjacent gate patterns such as gate patterns 30 and 32 and overlapping the diffusion regions 48. The dummy MTJs 70 on the other hand are disposed in the word line connecting region 24 between two adjacent gate patterns such as gate patterns 30, 32 and also between two diffusion regions 48 while not overlapping any of the gate patterns and/or diffusion regions 48.

As shown in the cross-sectional views in FIGS. 5-6, the MTJs 68, dummy MTJs 70, and metal interconnections 64, 66 or third level metal interconnect layer M3 are preferably disposed on the same level, in which the arrangement of dummy MTJs 70 and metal interconnections 64, 66 shown in FIG. 5 involves repeatedly disposing one dummy MTJ 70 immediately adjacent to a metal interconnection 64, 66. Similar to the aforementioned embodiment, no metal interconnection is disposed directly under the dummy MTJs 70 as the bottom portion or the bottom electrodes 82 under the dummy MTJs 70 preferably contact the IMD layer 76 directly.

Nevertheless, in contrast to only a single gate structure or gate pattern 34 from the horizontal portion of the H-shape profile of the gate pattern is disposed under the dummy MTJ 70 in the aforementioned embodiment, two gate patterns such as gate patterns 30, 32 are disposed under the dummy MTJs 70 in this embodiment such that each of the dummy MTJs 70 preferably not overlapping any of the gate structures or gate patterns 30, 32.

In current design of embedded MRAM array cells, a plurality of dummy rows or dummy regions are designed to fill the space between active regions and word line connecting region used for connecting to the word lines, in which a plurality of dummy MTJs are disposed in the dummy regions while no MTJs including active MTJs or dummy MTJs are formed in the word line connecting region. Moreover, no diffusion regions are also formed in the word line connecting region in current embedded MRAM cells. To prevent upper level metal interconnections from having contaminations and/or inducing leakages, current MRAM cells combine the three regions of the active regions, the dummy regions, and the word line connecting region to form the core layout pattern of the cell. This design however not only consumes a lot of space but also affects the overall performance substantially. To resolve this issue and improve the performance of the device, the present invention provides a novel layout pattern for MRAM cell by eliminating the dummy region between active regions and word line connecting region and integrating dummy MTJs and diffusion regions into the word line connecting region, in which the gate patterns extending from an active region through the word line connecting region to another active region could include a H-shape profile if viewed from a top view perspective as disclosed in the aforementioned first embodiment or adjacent two gate patterns could not contacting each other as disclosed in the aforementioned second embodiment. By following the above design it would be desirable to save a great portion of space and improve leakage of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern for magnetoresistive random access memory (MRAM), comprising:
    a substrate having a first active region, a second active region, and a word line connecting region between the first active region and the second active region;
    a first gate pattern extending along a first direction from the first active region to the second active region;
    a second gate pattern extending along the first direction from the first active region to the second active region;
    a first magnetic tunneling junction (MTJ) between the first gate pattern and the second pattern and within the word line connecting region, wherein the first MTJ comprises a dummy MTJ;
    a second MTJ between the first gate pattern and the second gate pattern in the first active region, wherein top surfaces of the first MTJ and the second MTJ are coplanar; and
    a first diffusion region and a second diffusion region extending along a second direction and adjacent to the first gate pattern and the second gate pattern in the word line connecting region, wherein the first MTJ is between and not overlapping the first diffusion region and the second diffusion region.

2. The layout pattern for MRAM of claim 1, further comprising a metal interconnection on a same level as the first MTJ in the word line connecting region.

3. The layout pattern for MRAM of claim 1, wherein the first direction is orthogonal to the second direction.

4. The layout pattern for MRAM of claim 1, further comprising a third MTJ between the first gate pattern and the second gate pattern in the second active region.

5. The layout pattern for MRAM of claim 4, further comprising:
- a first metal interconnection directly under the second MTJ;
- a second metal interconnection directly under the third MTJ;
- a first inter-metal dielectric (IMD) layer around the first MTJ, the second MTJ, and the third MTJ;
- a second IMD layer around the first metal interconnection and the second metal interconnection; and
- a stop layer under the second IMD layer.

6. The layout pattern for MRAM of claim 5, wherein the second IMD layer is under the first IMD layer.

7. The layout pattern for MRAM of claim 5, wherein a top surface of the second IMD layer comprises a curve.

8. The layout pattern for MRAM of claim 5, wherein bottom surfaces of the stop layer and the first metal interconnection are coplanar.

9. The layout pattern for MRAM of claim 1, wherein bottom surfaces of the first MTJ and the second MTJ are coplanar.

\* \* \* \* \*